United States Patent [19]

Nakashima

[11] Patent Number: 5,517,144
[45] Date of Patent: May 14, 1996

[54] POWER-ON RESET CIRCUIT

[75] Inventor: Katsuya Nakashima, Nagasaki, Japan

[73] Assignee: Sony Corporation, Tokyo, Japan

[21] Appl. No.: 257,145

[22] Filed: Jun. 9, 1994

[30] Foreign Application Priority Data

Jun. 25, 1993 [JP] Japan .................................. 5-179761

[51] Int. Cl.⁶ .......................... H03K 17/22; H03K 3/281
[52] U.S. Cl. ........................... 327/198; 327/215; 327/208
[58] Field of Search ..................................... 327/143, 198,
327/55, 57, 203, 206, 208, 220, 215, 210,
374, 389, 391, 214, 439, 484, 202

[56] References Cited

U.S. PATENT DOCUMENTS

| | | | |
|---|---|---|---|
| 3,061,942 | 10/1962 | Harrison | 327/214 |
| 3,508,081 | 4/1970 | Matsuda | 327/439 |
| 4,001,609 | 1/1977 | Sickert | 307/268 |
| 4,169,233 | 9/1979 | Haraszti | 327/57 |
| 4,591,745 | 5/1986 | Shen | 327/143 |
| 4,698,531 | 10/1987 | Jones | 327/143 |
| 4,818,904 | 4/1989 | Kobayashi | 307/594 |
| 4,837,458 | 6/1989 | Kawahata | 327/208 |
| 5,113,098 | 5/1992 | Teymouri | 327/581 |
| 5,311,070 | 5/1994 | Dooley | 327/208 |

FOREIGN PATENT DOCUMENTS

| | | | |
|---|---|---|---|
| 0342735 | 11/1989 | European Pat. Off. | H03K 17/22 |
| 1908115 | 9/1970 | Germany . | |
| 60-189029 | 9/1985 | Japan . | |
| 1212024 | 8/1989 | Japan | H03K 17/22 |
| 6501840 | 8/1966 | Netherlands . | |

OTHER PUBLICATIONS

"Self–Initialized, Fused Comparator Utilizing No Standby Power", IBM Technical Disclosure Bulletin, vol. 34, No. 1, Jun., 1991, p. 294.

Primary Examiner—Timothy P. Callahan
Assistant Examiner—Terry L. Englund
Attorney, Agent, or Firm—Ronald P. Kananen

[57] ABSTRACT

A power-on reset circuit provides the stable generation of a reset signal without being affected by the rising characteristic of a power-supply voltage. A flip-flop having a pair of cross-connected inverters is used, a common connection point between a diode and a capacitor connected to each other in series is connected to a node, which is one output of the flip-flop, an output signal at a node, which is another output of the flip-flip, is supplied to a reset pulse generator via an inverter, so that a reset pulse is generated based on a detected output signal change.

16 Claims, 5 Drawing Sheets

POWER-ON RESET CIRCUIT

BACKGROUND OF THE INVENTION

1. Field of the Invention

The present invention relates to a power-on reset circuit that generates a reset signal when power is turned on and, more particularly, to a power-on reset circuit that generates a reset signal when a supply voltage has reached a certain threshold level.

2. Description of the Related Art

A power-on reset circuit as shown in FIG. 1 has been proposed as a type of the power-on reset circuit mentioned above.

Referring to FIG. 1, a resistor R1 and a capacitor C1 are connected to each other in series between Vcc power and ground. A node N1, a common connection point between the resistor R1 and the capacitor C1, is connected to an input terminal of an inverter 1. The inverter 1 is composed of a p-channel MOS (Metal Oxide Semiconductor) transistor Q1 and an n-channel MOS transistor Q2, both of which are connected to each other in series between power-supply voltage Vcc and ground, gates of the transistors Q1, Q2 being commonly connected to each other. In the inverter 1, a gate common connection point between the MOS transistors Q1 and Q2 provides an input terminal, which is connected to the node N1, while a node N2, which is a drain common connection point between the transistors, provides an output terminal from which a reset signal is outputted.

An operation of a power-on reset circuit of related art having the above-mentioned constitution will be described.

First, when the Vcc power is turned on, the power-supply voltage Vcc goes up. When a potential difference relative to the node N1 has exceeded a threshold voltage of the p-channel MOS transistor Q1, the MOS transistor Q1 is turned on. In the initial stage of this power-on operation, a charging voltage of the capacitor C1 remains low.

When the p-channel MOS transistor Q1 is turned on, a potential of the node N2 goes high, outputting a reset signal. Then, as time passes, the charging voltage of the capacitor C1 increases and when the potential of the node N1 exceeds a threshold voltage of the n-channel MOS transistor Q2, the MOS channel transistor Q2 is turned on. This causes the potential of the node N2 to go low, thereby preventing the reset signal from being outputted.

However, in a power-on reset circuit of the related art having the above-mentioned constitution, when the power voltage Vcc is quickly raised, the reset signal is stably generated by the above-mentioned circuit operation; when the power voltage Vcc is very slowly raised, the potential of the node N1 exceeds the threshold voltage of the n-channel MOS transistor Q2 before the potential difference between the power-supply voltage Vcc and the node N1 exceeds the threshold voltage of the p-channel MOS transistor Q1, thereby failing to generate the reset signal.

OBJECTS AND SUMMARY OF THE INVENTION

It is therefore an object of the present invention to provide a power-on reset circuit that generates a reset signal with stability without being affected by a rising characteristic of a power-supply voltage.

In carrying out the invention and according to one aspect thereof, there is provided a power-on reset circuit comprising a flip-flop composed of a pair of inverters each connected to a load and having MIS (Metal Insulator Semiconductor) transistors connected to the load in series, in which the inverters are cross-connected to each other; a series-connected circuit composed of a diode device, or diode-connected transistor, and a capacitor connected between a first power supply and a second power supply in series, in which a common connection point between the diode and the capacitor is connected to one output of the flip-flop; and a reset signal generator for generating a reset signal based on a change in one of the output signals of the flip-flop.

In carrying out the invention and according to another aspect thereof, there is provided the power-on reset circuit wherein the above-mentioned flip-flop is composed of a pair of inverters whose load is made up of a high resistance element.

In carrying out the invention and according to still another aspect thereof, there is provided the power-on reset circuit wherein the above-mentioned flip-flop has a diode connected to the above-mentioned MIS transistors in series.

Accordingly, in the power-on reset circuit, the flip-flop has only one stable point when a supply voltage is sufficiently low and two stable points when the supply voltage is sufficiently high. This flip-flop recognizes the state in which the supply voltage is high and the state in which the supply voltage is low. The reset signal is generated between the two states. In this setup, the reset signal can be generated even if the supply voltage rises very slowly, thereby providing a stable reset-signal generation independently of how the power supply rises.

Since the resistors used on the inverters constituting the flip-flop of this power-on reset circuit are made of high resistance elements, a leak current can be suppressed to a sufficiently low level.

Since the diode is connected in series to the driving transistors of the inverters constituting the flip-flop, the driving transistors of the output-side inverter will not turn on when the supply voltage drops quickly to 0 V, thereby making it possible to generate the reset signal when the power voltage has risen again.

The above and other objects, features and advantages of the present invention will become more apparent from the accompanying drawings, in which like reference numerals are used to identify the same or similar parts in several views.

DETAIL DESCRIPTION OF THE PREFERRED EMBODIMENTS

This invention will be described in further detail by way of example with reference to the accompanying drawings.

Figure 1:
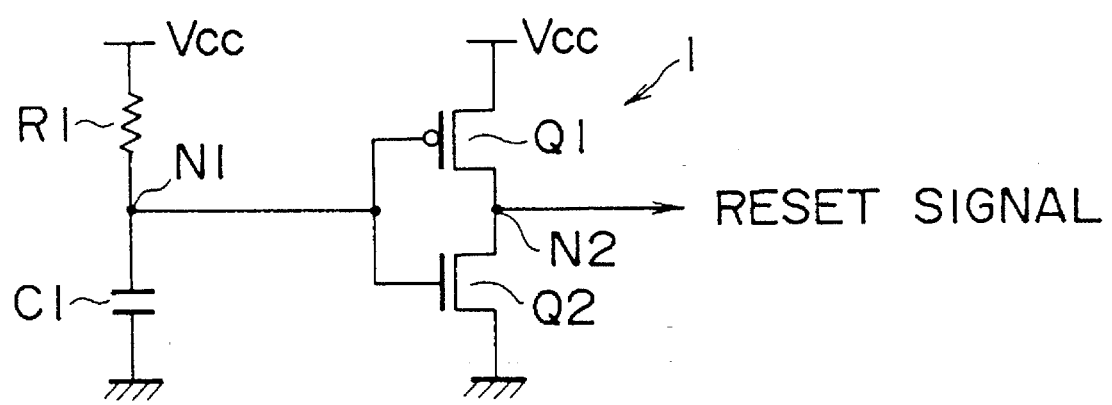
FIG. 1 is a diagram illustrating a power-on reset circuit of related art.
Figure 2:
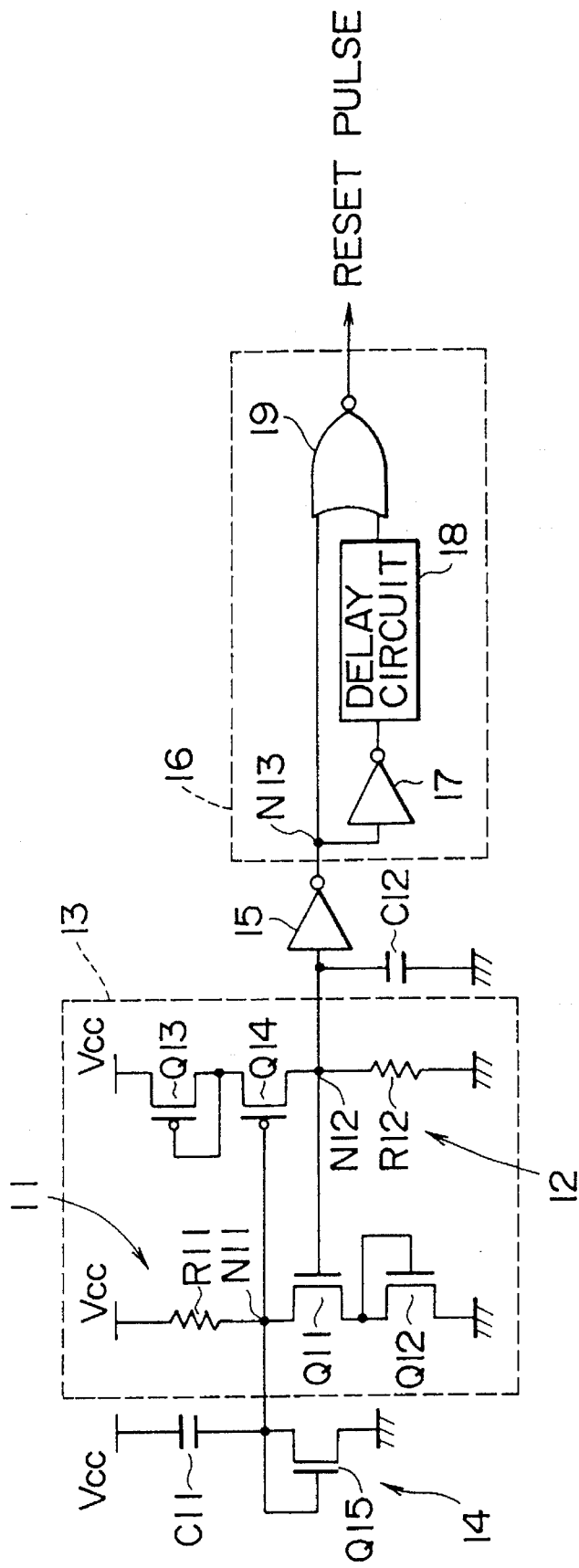
FIG. 2 is a diagram illustrating a power-on reset circuit practiced as one preferred embodiment of the invention.

Referring to FIG. 2, there is shown a circuit diagram of a power-on reset circuit practiced as one preferred embodiment of the invention. In this embodiment, a MOS (Metal Oxide Semiconductor) transistor is used for a MIS (Metal Insulator Semiconductor) transistor for example.

Referring to FIG. 2 again, a resistor R11 as a load, a driving n-channel MOS transistor Q11, and a diode-connected n-channel MOS transistor Q12 are connected in series between a Vcc power supply (a first power supply) and ground (a second power supply), thereby constituting an inverter 11. Likewise, a diode-connected p-channel MOS transistor Q13, a driving P-channel MOS transistor Q14, and a resistor R12 as a load are connected in series between a Vcc power supply and ground, thereby constituting an inverter 12.

These inverters 11 and 12 are cross-connected to each other to constitute a flip-flop 13. That is, a node N11, which is an output of the inverter 11, is connected to a gate of the driving p-channel MOS transistor Q14 of the inverter 12; a node N12, which is an output of the inverter 12, is connected to a gate of the driving n-channel MOS transistor Q11 of the inverter 11.

In this flip-flop 13, values of the resistors R11 and R12 serving as loads for the inverters 11 and 12 are on the order of several giga ohms (GΩ) in order to suppress a leak current to a sufficiently low level (down to nano ampere (nA) level).

Between the Vcc power supply and ground, there is connected a series-connected circuit 14 composed of a capacitor C11 and a diode-connected n-channel MOS transistor Q15. A common connection point of the series-connected circuit 14 is connected to one of outputs of the flip-flop 13, for example the node N11 of the inverter 11. It should be noted that a boundary between two stable states of the flip-flop 13 is determined by the values of the resistors R11 and R12 and subthreshold currents of MOS transistors Q11 through Q15.

The other output of the flip-flop 13, that is, a point between the node N12 and ground of the inverter 12, is connected to a capacitor C12. One of the output signals of the flip-flop 13, for example an output signal coming from the node N12 of the inverter 12, is supplied to a reset pulse generator 16 via an inverter 15 based on a change in the signal.

The reset pulse generator 16 comprises an inverter 17 for inverting a signal at a node N13, which is an output of the inverter 15, a delay circuit 18 for delaying the inverted signal coming from the inverter 17 for a predetermined period of time, and a NOR gate 19 in which the signal at the node N13 and the signal delayed by the delay circuit 18 are entered. Based on a difference between these signals, a reset pulse is generated. A width of the reset pulse is determined by the delay time of the delay circuit 18. For the delay circuit 18, a circuit is used having a constitution in which inverters are concatenated in an amount corresponding to the delay time.

Now, an operation of the above-mentioned embodiment will be described. For simplicity, it is assumed that the rising time of the power-supply voltage Vcc is infinite.

First, when Vcc=0 V, the potentials at the nodes N11 and N12 are both 0 V. If the power-supply voltage Vcc is sufficiently low, impedance of the MOS transistors Q11 through Q15 is sufficiently higher than that of the resistors R11 and R12, so that the flip-flop 13 has only one stable point. That is, the potential at the node N11 is fixed to the Vcc level and the potential at the node N12 to ground level.

When the power-supply voltage Vcc gets near a threshold value of the inverter 12, the impedance of the MOS transistor Q13 and Q14 becomes generally equal to that of the resistor R12, causing the potential at the node N12 to shift from a low level to a high level.

When the potential at the node N12 has reached a potential sufficient for the MOS transistor Q11 to turn on, the MOS transistor Q11 turns on, the potential at the node N11 goes low, and the content of the flip-flop 13 is inverted.

The inversion (shifting of the potential at the node N12 from low to high level) of the content of the flip-flop 13 is transmitted to the reset pulse generator 16 via the inverter 15. This causes the reset pulse generator 16 to generate a reset pulse.

That is, when the potential at the node N12 shifts from a low to a high level, a signal that shifts from a high to a low level appears at the node N13.

In the reset pulse generator 16, the signal at the node N13 is inverted by the inverter 17 and delayed by the delay circuit 18 by the predetermined period of time. The delayed signal is OR-ed with the signal at the node N13 to generate the reset pulse.

When the power-supply voltage Vcc gets sufficiently high, the potential at the node N11 becomes a gate voltage at which a subthreshold current of the MOS transistor Q12 becomes equal to a current flowing in the resistor R11 and the potential at the node N12 becomes a gate voltage at which a subthreshold current of the MOS transistor Q13 becomes equal to a current flowing in the resistor R12.

It should be noted that a channel length of the MOS transistor Q15 is set long and a channel length of the MOS transistor Q12 is set standard so that the subthreshold current of the MOS transistor Q12 becomes greater than that of the MOS transistor Q15.

The MOS transistor Q15 is provided only as an external trigger for prompting the inversion of the flip-flop 13, thereby making an inverted state hard to revert again.

When the rising time of the power-supply voltage Vcc is finite, the potential at the node N11 is fixed to the power-supply Vcc level and the potential at the node N12 to ground level by coupling the capacitors C11 and C12.

Figure 3:
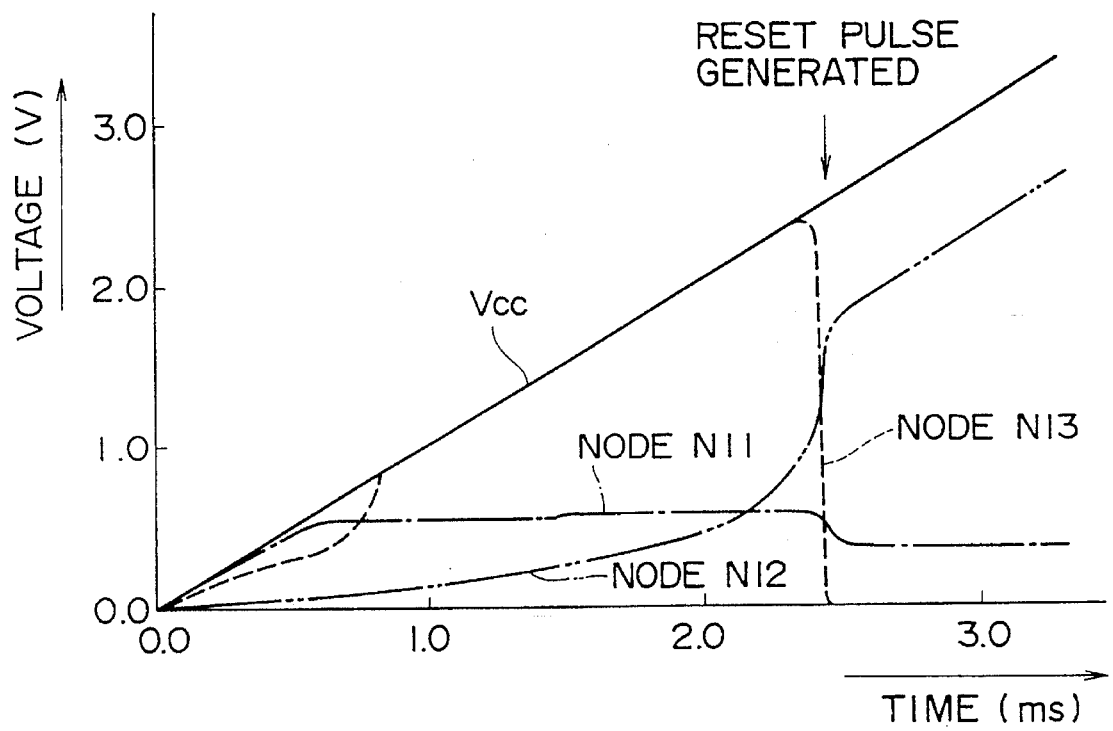
FIG. 3 is a diagram illustrating waveforms of nodes obtained when a rising time of the power-supply voltage Vcc of the power-on reset circuit of FIG. 2 is 5 ms.

Referring to FIG. 3, there are shown waveforms of the nodes N11, N12, and N13 when the rising time (Vcc=0 V to 5 V) of the power-supply voltage Vcc is 5 ms.

As clearly seen from FIG. 3, the above-mentioned constitution allows the flip-flop 13 to recognize whether the power-supply voltage Vcc is in a high state or a low state and generate a reset pulse at a boundary in between, thereby securely providing reset pulse generation even if the power-supply voltage Vcc takes very long to rise.

Meanwhile, a variation in the potentials at the nodes N11 through N13 has a hysteresis and presents different hysteresis characteristics for rising and falling of the power-supply voltage Vcc.

Figure 4:
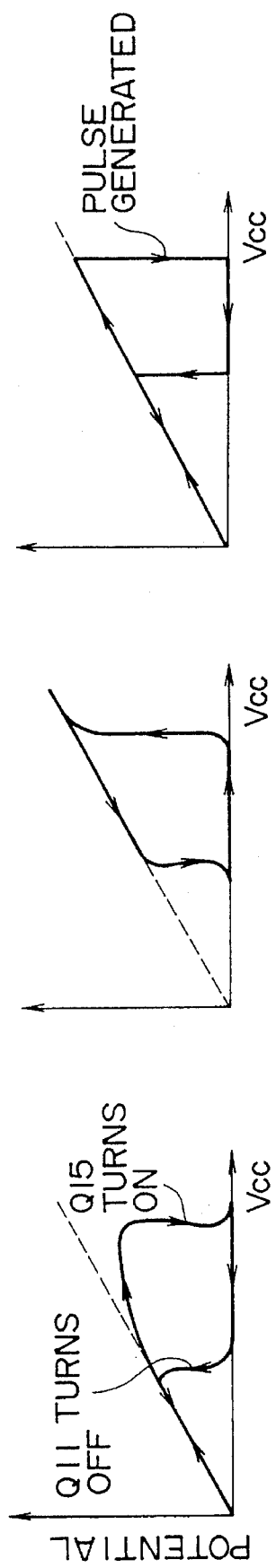
FIGS. 4(A) to 4(C) are diagrams illustrating potential variations of node N11, node N12 and node N13 relative to the power-supply voltage Vcc respectively.

Referring to FIGS. 4(A) to 4(C), there are shown variations of the potentials at the nodes N11 (A), N12 (B), and N13 (C) relative to the power-supply voltage Vcc. Referring to FIG. 4(C), the reset pulse is generated when the potential at the node N13 shifts from high to low as described above.

Now, a circuit operation will be described that takes place when the power-supply voltage Vcc temporarily drops in a time shorter than a time of discharge by the resistors R11 and R12 such as the case of momentary turn-off of power and rises again.

First, in the case where the power-supply voltage Vcc quickly drops to 0 V, the potential at the node N11 becomes about −0.7 V (a drop determined by the pn junction) due to the supply of a charge by the pn junction of the drains of the MOS transistors Q11 and Q14.

Then, when the power-supply voltage Vcc rises again, the transistor Q14 will turn on if the potential at the node N11 is as low as about −0.7 V. Consequently, even in a low power-supply voltage state, the potential at the node N12 becomes Vcc level and the potential at the node N13 becomes ground level, thereby preventing the reset pulse from being generated.

However, in the above-mentioned preferred embodiment of the invention, the diode-connected MOS transistor Q12 is connected to the MOS transistor Q11 in series and the diode-connected MOS transistor is connected to the MOS transistor Q14 in series, so that even when the power-supply voltage Vcc quickly drops to 0 V, the transistor Q14 will not turn on. Therefore, when the power-supply voltage Vcc rises again, the reset pulse can be generated securely.

It will be apparent to those skilled in the art that, although the above-mentioned embodiment uses the diode-connected MOS transistors Q12 and Q13, the embodiment can use diodes instead.

Figure 5:
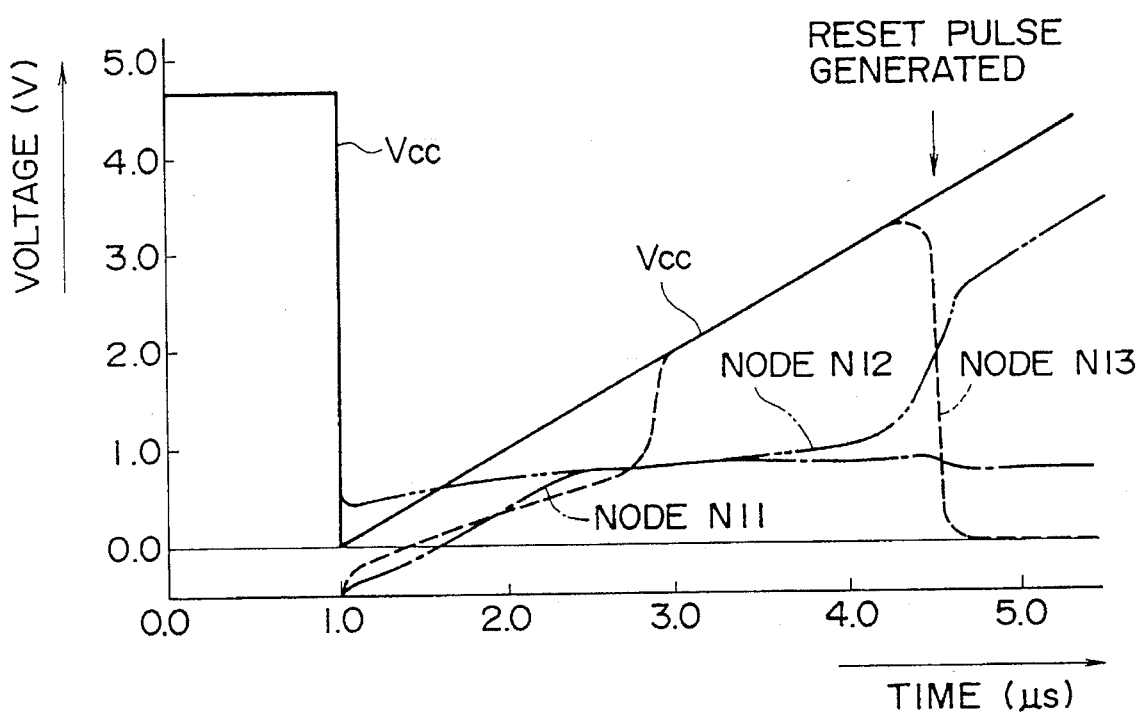
FIG. 5 is a diagram illustrating waveforms of the nodes obtained when the power-supply voltage Vcc has fallen temporarily and then risen again.

Referring to FIG. 5, there are shown waveforms of the nodes N11, N12, and N13 obtained when the power-supply voltage Vcc has fallen temporarily and then risen again.

It should be noted that, in the above-mentioned constitution, if the threshold voltage of the p-channel MOS transistor Q13 is Vth, the potential at the node N12 rises only up to Vcc−Vth, thereby making it possible for a rush current to flow in the inverter 15.

The rush current to flow in the inverter 15 can be suppressed to a level lower than a current that flows in the resistor R12 by setting the threshold voltage of the p-channel MOS transistor constituting the inverter 15 to a level higher than the threshold voltage of the p-channel MOS transistor Q13 (for example, by setting a channel length of the transistor constituting the inverter 15 relatively long).

As described and according to the invention, there is provided a power-on reset circuit using a flip-flop composed of a pair of cross-connected inverters, wherein a common connection point between a diode and a capacitor connected to each other in series is connected to one output of the flip-flop to make the flip-flop recognize states in which a power supply voltage is high and low, thereby generating a reset signal at a boundary between the states. This novel setup surely generates the reset signal even when the power-supply voltage rises very slowly, thereby providing the stable generation of the reset signal without being affected by power-supply rising time.

Use of a high resistance element for a resistor for the inverters constituting the flip-flop suppresses a leak current to a sufficiently low level.

Further, series connection of a diode to each of the driving transistors for the inverters constituting the flip-flop prevents the driving transistor of the output-side inverter from turning on, thereby ensuring the stable generation of the reset signal even when the power-supply voltage temporarily drops and then rises again.

While the preferred embodiment of the present invention has been described using specific terms, such description is for illustrative purposes only, and it is to be understood that changes and variations may be made without departing from the spirit or scope of the appended claims.

What is claimed is:

1. A power-on reset circuit comprising:
    a first power supply;
    a second power supply;
    a flip-flop having a pair of cross-connected inverters each comprising a driving transistor, a diode-connected device, and a load connected in series between said first power supply and said second power supply, an output of one of said pair of inverters providing an input to the other of said pair of inverters and an output of said other of said pair of inverters providing an input to said one of said pair of inverters, wherein when the first power supply is low, an impedance of the driving transistor and diode-connected device of each of said pair of inverters is sufficiently higher than that of the loads of each of the inverters so that the flip-flop has only one stable point, and when the potential of the first power supply is sufficiently high to cause at least one of the transistors in either of said pair of inverters to turn on, an output of the flip-flop is inverted;
    a series-connected circuit composed of a diode device and a capacitor connected to each other in series between said first power supply and said second power supply, a common connection point between said diode device and said capacitor being connected to the output of one of said inverters of said flip-flop; and
    a reset signal generator for generating a reset signal based on a change in an output signal of one of said inverters of said flip-flop.

2. The power-on reset circuit as defined in claim 1, wherein each said load is a resistance element.

3. The power-on reset circuit as defined in claim 1, wherein said driving transistor and said diode-connected device of each inverter are connected in series to each other.

4. The power-on reset circuit as defined in claim 1, wherein said pair of inverters are respectively composed of a p-type metal oxide semiconductor transistor and an n-type metal oxide semiconductor transistor.

5. The power-on reset circuit as defined in claim 1 wherein said diode device of said series-connected circuit is a diode-connected transistor.

6. A power-on reset circuit, comprising:
    a first power supply Vcc;
    a second power supply;
    a first inverter having an input and an output and connected between said first power supply and said second power supply, said first inverter comprising a first load resistor, a first driving transistor, and a first diode device respectively connected in series between said first power supply and said second power supply;
    a second inverter having an input and an output and connected between said first power supply and said second power supply, said second inverter comprising a second load resistor, a second driving transistor, and a second diode device respectively connected between said second power supply and said first power supply, wherein said first inverter and said second inverter are cross-connected to each other to constitute a flip-flop wherein the output of said first inverter is provided as the input to said second inverter, and the output of said second inverter is provided as the input to said first inverter;
    an input circuit having a connection node connected to the output of said first inverter; and
    a reset pulse generator connected to the output of said second inverter, for generating a reset pulse based on a difference between said second inverter output and a delayed signal based on said second inverter output.

7. The power-on reset circuit as set forth in claim 6 wherein each of said first diode device and said second diode device includes a diode means respectively connected to said first driving transistor and said second driving transistor so that when the first power supply voltage Vcc quickly drops to 0 V, the respective driving transistor will not turn on, thus when the power supply voltage Vcc rises, the reset pulse is generated by said reset pulse generator.

8. The power-on reset circuit as set forth in claim 6 wherein said first diode device and said second diode device are each respectively a diode-connected transistor.

9. The power-on reset circuit as set forth in claim 6 wherein said first load resistor and said second load resistor are sized sufficiently large on the order of giga ohms to suppress leak current.

10. The power-on reset circuit as set forth in claim 6 wherein said input circuit comprises a capacitor and a diode device connected in series between said first power supply and said second power supply, a common connection point between said capacitor and said diode device connected to the output of said first inverter, a boundary between two stable states of the flip-flop being determined by the values of the first load resistor and the second load resistor and the subthreshold currents of the first driving transistor, the second driving transistor, the first diode device, and the second diode device.

11. The power-on reset circuit as set forth in claim 10 wherein at least one of said diode devices is a diode-connected transistor.

12. The power-on reset circuit as set forth in claim 6 wherein said reset pulse generator is connected to the output of said second inverter through a third inverter, said third inverter being connected in series with a capacitor between said reset pulse generator and said second power supply.

13. The power-on reset circuit as set forth in claim 6 wherein said reset pulse generator comprises a fourth inverter for inverting an output of a third inverter connected to said flip-flop, a delay circuit for delaying an inverted signal from the fourth inverter for a predetermined period of time, and a logic gate for generating a reset pulse based on a difference between a signal at the output of said third inverter and the output of the delay circuit.

14. The power-on reset circuit as set forth in claim 13 where a width of a reset pulse generated by said reset pulse generator is determined by a delay time of the delay circuit.

15. The power-on reset circuit as set forth in claim 6 wherein a first node is provided at a common connection between said first load resistor and said first driving transistor, and a second node is provided at a common connection between said second load resistor and said second driving transistor, so that when the potential of the first power supply is 0 V, the potential at each of the first node and the second node is 0 V, and when the potential of the first power supply is near a threshold value of the second inverter, an impedance of the second driving transistor and the second diode device becomes about equal to that of the second load resistor causing potential at said second node to shift from a low level to a high level.

16. The power-on reset circuit as set forth in claim 15 wherein when a potential at the second node has reached a potential sufficient to turn on the first driving transistor, the potential at the first node becomes low to invert the output of said second inverter to the reset generator to generate a reset pulse.

\* \* \* \* \*